United States Patent
Hsu et al.

(10) Patent No.: US 6,295,545 B1
(45) Date of Patent: Sep. 25, 2001

(54) REDUCTION OF EXECUTION TIMES FOR CONVOLUTION OPERATIONS

(75) Inventors: William Hsu, San Jose; Taiwei Yin, Milpitas, both of CA (US)

(73) Assignee: PC-Tel, Inc., Milpitas, CA (US)

( * ) Notice: Subject to any disclaimer, the term of this patent is extended or adjusted under 35 U.S.C. 154(b) by 0 days.

(21) Appl. No.: 09/192,394

(22) Filed: Nov. 12, 1998

(51) Int. Cl.$^7$ .................................................. G06F 17/10
(52) U.S. Cl. ........................................................ 708/319
(58) Field of Search .................. 708/319, 315, 708/420, 603

(56) References Cited

U.S. PATENT DOCUMENTS

| | | | |
|---|---|---|---|
| 5,297,069 | * 3/1994 | Asato et al. | 708/319 |
| 5,513,223 | * 4/1996 | Shoji | 708/319 |
| 5,648,922 | * 7/1997 | Han | 708/315 |
| 5,886,913 | * 3/1999 | Marguinaud et al. | 708/319 |
| 5,904,731 | * 5/1999 | Matsui | 708/319 |
| 5,966,314 | * 10/1999 | Lee | 708/319 |

* cited by examiner

*Primary Examiner*—David H. Malzahn
(74) *Attorney, Agent, or Firm*—Skjerven Morrill MacPherson LLP; Carmen C. Cook

(57) ABSTRACT

A convolution operation such as an FIR filter determines sums of products by loading first and second sequences of values into a register file of a processor, each value being in a separate register in the register file. The processor determines a sum of products, for example, by executing a series on multiply-and-accumulate instructions on the previously loaded values from the register file. For a next sum, one or more values is loaded into the register file to replace some or all of the values from the second sequence. The first sequence of values is left intact in the register file for use in calculating the next sum. For an FIR filter, only a single value from the second sequence is replaced, and the next sum uses most of the previously loaded second sequence. This reduces the number of required memory accesses and reduces processing time required for convolution operations. A sequence of sums of products for the FIR filter requires loading of only one new value per filtered value determined.

16 Claims, 2 Drawing Sheets

REDUCTION OF EXECUTION TIMES FOR CONVOLUTION OPERATIONS

BACKGROUND

1. Field of the Invention

This invention relates to methods and systems that efficiently use a processor to perform convolution operations, and particularly to communication systems such as modems that perform such operations in interpreting communication signals.

2. Description of Related Art

Many digital signal processing systems execute routines that require repeated summing of products. For example, communication systems including modems often convert communication signals to sequences or digital samples and then filter and transform the sequences to extract data. Encoding data for transmission requires similar digital processing. The specific processing required depends on the particular protocols implemented in a communication signal, but such processing often includes finite impulse response (FIR) filtering, fast Fourier transforms (FFTs), and spectral analysis. The term "convolution operation" as used herein refers to FIR filters, FFTs, and similar processing operations that determine of a series of sums. Equation 1 illustrates a sum basic for a convolution operation.

$$\text{Equation 1:} \quad s(k) = \sum_{i=-\infty}^{\infty} s_{in}(i) * s_k(i)$$

In Equation 1, $s_{in}$ is an input sequence, $s_k$ is a sequence that depends on index k, and s is a sequence that is the convolution of sequences $s_{in}$ and $s_k$. Although Equation 1 shows the range of the summation as infinite, the actual range is limited to a range of interest or a range where both sequences $s_k(i)$ and $s_k(i)$ are non-zero. An example application is a Fourier transform where sequence $s_{in}$ is time-domain sequence to be transformed, sequence $s_k$ represents a function associated with frequency k, and sequence s is the Fourier transform of $s_{in}$. Complete generation of the convolution s requires repeating the sum of Equation 1 for every value of k that is of interest.

A finite impulse response (FIR) filter is a type of convolution commonly used for filtering sequences. Equation 2 shows a summation for an M-tap FIR filter.

$$\text{Equation 2:} \quad F(k) = \sum_{i=0}^{M-1} C(i) * S(k-i)$$

In Equation 2, values C(0) to C(M−1) are filter coefficients of the FIR filter, values S(k−i) are from a sequence being filter, and value F(k) is the filtered value for index value k. Generally, a FIR filter operation repeats the summation of Equation 2 N times to generate as a sequence of filtered values F(k) for index k equal to 0 to N−1.

Table 1 contains a C programming language routine that generates N filtered values using an M-tap FIR filter operation according to Equation 2.

TABLE 1

```
for (k=0; k<N; k++)
{
    F[k] = 0;
    for (i = 0; i<M; i++)
        F[k] += C[i]*S[k-i]; /*sum instruction*/
}
```

The routine of Table 1 executes a sum instruction N*M times. In a typical processing system, repeated execution of the sum instruction requires 2*M*N memory loads for filter coefficients C[i] and input values S[k=i], M*N multiplications, M*N additions, and M*N memory stores for accumulate filtered values F[k]. The routine of Table 1 is memory I/O bound in that the number of memory accesses (3M*N) is greater than the number of arithmetic operations (2M*N).

Memory access times are critical to the performance of a memory I/O bound operations such as the FIR filter routine of Table 1. However, for most systems, memory access times are slow because a typical memory system for a processor is much slower than the processor's operating frequency. Fast memory caches improve access times, but when N or M is large, the cache may be insufficient to hold the filter coefficients and the data being filtered. Thus, cache misses result, and the filter operations require frequent access to slower memory. Processes that require fewer memory accesses and improve performance of convolution operations are sought.

SUMMARY

In accordance with the invention, efficient use of a processor's registers reduces the number of memory access required for a series of sums during a convolution operation. For example, for an FIR filter operation, a processor loads filter coefficients into separate registers in a register file and a portion of the sequence to be filtered into other registers in the register file. The filter coefficients remain intact in the register file for a series of summations that determine a series of filtered values. For each filtered value, as few as a single new value from input sequence is loaded into the register file. The new value replaces the eldest input value currently in the register file. Thus after the first summation, each summation requires only one new value loaded.

In accordance with one embodiment of the invention, a method for performing a convolution operation, includes loading first and second sequences of values into first and second sets of registers in a register file of a processor. The processor then determines a first sum by summing a set of products, wherein each product results from a multiplication of a value from the first set of registers and a value from the second set of registers. After determining the first sum, the processor loads a new value into the second set of registers to replace one of the values that was previously loaded into the second set of registers. After loading the new value, the processor sums a new set of products, wherein each product results from a multiplication of a value from the first set of registers and a value from the second set of registers. One of the products in the new set includes a product of a value from the first sequence and the new value. A series of sums can be determined in this fashion where each sum is determined from values loaded for previous sums and one or more new values loaded for the sum. When the convolution is an FIR operation, the first set of values includes filter coefficients, and the second set of values includes part of an input data sequence to be filter. Each new sum retains the filter coefficients in the register file and requires only one new value from the input data sequence.

When the register file of a processor is too small to contain all the values required for each sum, the convolution operation can be broken into smaller convolution operations. The processor performs each of the smaller convolution operations in the manner described above and generates partial sums. Combining the partial sums provides the results of the original convolution operation.

DETAILED DESCRIPTION OF THE PREFERRED EMBODIMENTS

In accordance with an aspect of the invention, a system such a host signal processing modem has a processor that performs convolution operations that require few memory accesses. In one such operation, the processor executes a routine that loads values for a first summation into separate registers in the processor's register file. The processor uses the values from the registers to perform all or part of the first summation and then stores a result. A following memory access loads one or more values as required for second summation, but the second summation mostly uses the values already in the registers for the first load. For a series of summation, each successive summation requires only one or two new values. Thus, the series of summations requires fewer memory accesses than are required for conventional convolution operations, and processing efficiency is improved.

Figure 1:
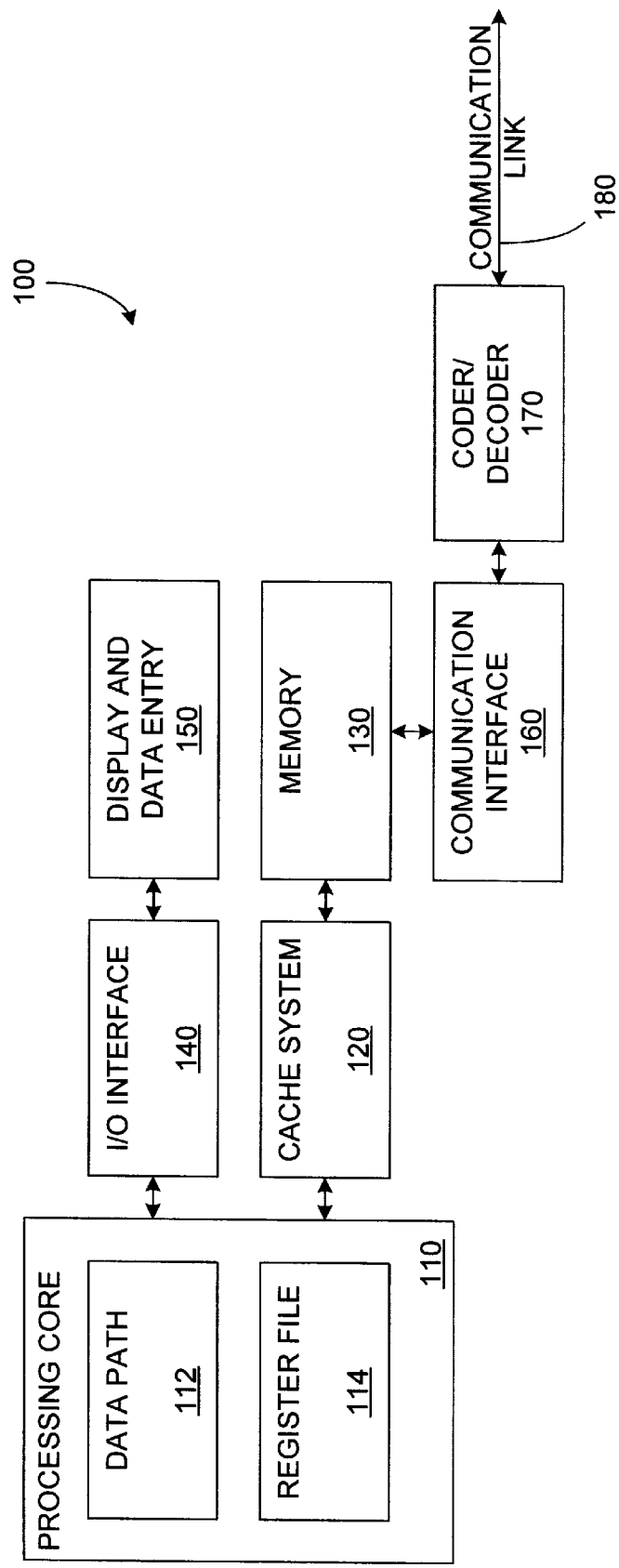
FIG. 1 shows a communication system for use of an embodiment of the invention.

FIG. 1 shows a communication system capable of performing a convolution process in accordance with the invention. System 100 connects to a communication link 180, such as telephone lines or a cellular telephone connection that supplies a received analog communication signal to and accepts a transmitted communication signal from a coder/decoder (codec) 170. Codec 170 converts the received analog communication signal into a series of digital samples that pass via an interface circuit 130 to a memory 130. Memory 130 is the host computer and connects via a cache system 120 to a processing core 110 of the host computer. The transfer of samples between memory 160 can be direct via a direct memory access (DMA) system (not shown) or through a programmed I/O that routes samples between communication interface 160 and the memory system via processing core 110. Other components of the host computer include display and data entry devices 150 and an interface 140 for devices 150.

In one embodiment of the invention, communication system 100 is a personal digital assistant (PDA), and data entry devices 150 include a touch sensitive LCD panel. An integrated microprocessor for the PDA includes processing core 110, cache system 120, and interfaces 140 and 160. Reducing the number of memory accesses in such communication systems is particularly important because such systems typically have relatively small cache memories.

In another embodiment of system 100, the host computer is personal computer, processing core 110 is part of x86-type processor, and communication interface 160 includes a system bus such as an ISA or PCI bus in the personal computer and a device interface on a modem card attached to the system bus. U.S. Pat. No. 5,787,305, entitled "Host Signal Processing Modem Using a Software Simulation of a UART" and U.S. Pat. No. 5,721,830, entitled "Host Signal Processing Communication System that Compensates for Missed Execution of Signal Maintenance Routines" describe similar communication systems that are suitable for implementation of convolution processes in accordance with the invention. These patents are hereby incorporated by reference herein in their entirety.

Figure 2:
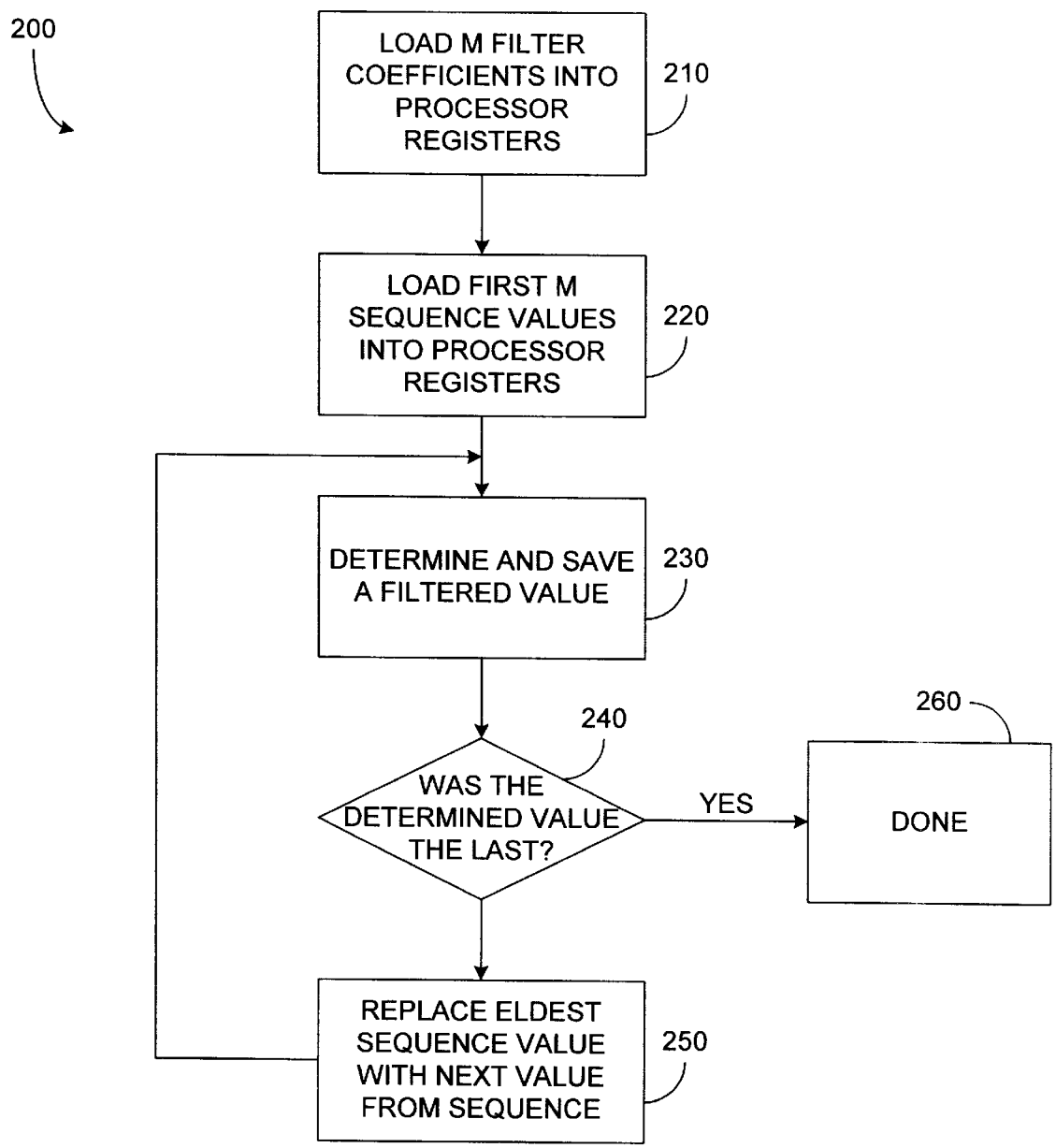
FIG. 2 shows a flow diagram of a FIR filter operation in accordance with an embodiment of the invention.

In accordance with the invention, a convolution process loads separate registers in a register file 114 of processing core 110 with values used in a first sum. Using separate registers prevents overwriting of values for determination of each term in a sum and preserves values needed for subsequent sums. Accordingly, the convolution process requires fewer memory accesses. More specifically, FIG. 2 shows a flow diagram of an M-tap FIR filter process 200 implemented in system 100 in accordance with an embodiment of the invention. In initial steps 210 and 220, process 200 loads filter coefficients and a first set of input values into separate registers in register file 114 of processing core 110. Accordingly, register file 114 must have sufficient available registers for M filter coefficients and M values from the input sequence. For example, a register file including 32 registers can accommodate a 16-tap filter if all of the filter coefficients and input values for a sum are simultaneously stored in the register file. However, registers required for loop indices or other purposes are unavailable for the filter operation. In a typical RISC-based CPU having 32 registers in a register file, about 24 to 25 registers are available, and the other registers are reserved, for example, for indexing or an operating system.

After all of the required filter coefficients and input values are in register file 114, step 230 determines a filtered value from the coefficients and input values in register file 114 and then saves the filtered value. More specifically, in step 230, data path 112 executes a series of multiplications and additions to accumulate a sum in an accumulator or a register. The determined filtered value from the accumulator or register is then written to memory 130 via cache system 120. Step 240 checks whether the determined filter value is the last filtered value required. If not, process 200 branches from step 240 to step 250 and replaces the eldest input value in register file 114 with the next value from the input sequence. After step 250, process 200 returns to step 230 to determine and save another filtered value. System 100 executes a loop including steps 230, 240, and 250 until the last required filter value is determined, and process 200 is done. After the first determination of a filtered value, process 200 loads only one input value per filter value determined. Accordingly, to determine N filtered values, process 200 requires 2M+N−1 loads of data from the memory system (cache system 120 or memory 130) and N stores of data to the memory system. In contrast, the conventional FIR filter operation described above requires 2M*N loads of data and M*N store operations. Thus, process 200 greatly reduces the number of memory accesses for data when compared to conventional FIR operations.

Typically, process 200 reduces processing time by reducing the number of memory access, but to determine the overall efficiency, the number of memory accesses for instructions and the relative chances of cache misses for both instructions and data must be considered. Table 2 contains a listing of pseudo-assembly language code for a 4-tap FIR filter in accordance with an embodiment of the invention.

TABLE 2

| | | |
|---|---|---|
| lea | F3,a0 | ; load pointer to the first filtered value in register a0 |
| lea | S0,a1 | ; load pointer to the first input value in register a1 |
| load | C0,d0 | ; load filter coefficients into registers d0 to d3 |
| load | C1,d1 | |
| load | C2,d2 | |
| load | C3,d3 | |
| load | (a1)+,d7 | ; load input values S0 to S3 in registers d7 to d4 |
| load | (a1)+,d6 | |
| load | (a1)+,d5 | |
| @sum1 | | |
| load | (a1)+,d4 | |
| clr | ACC | ; initialize accumulator |
| mac | d0,d4 | ; determine first term of first sum |
| mac | d1,d5 | ; accumulate second term of first sum |
| mac | d2,d6 | ; accumulate third term of first sum |
| mac | d3,d7 | ; accumulate fourth term of first sum |
| store | ACC,(a0)+ | ; store result F(3) |
| @sum2 | | |
| load | (a1)+,d7 | ; load next input value for next sum |
| clr | ACC | ; initialize accumulator |
| mac | d0,d7 | ; determine first term of second sum |
| mac | d1,d4 | ; accumulate second term of second sum |
| mac | d2,d5 | ; accumulate third term of second sum |
| mac | d3,d6 | ; accumulate fourth term of second sum |
| store | ACC,(a0)+ | ; store result F(4) |
| @sum3 | | |
| load | (a1)+,d6 | ; load next input value for next sum |
| clr | ACC | ; initialize accumulator |
| mac | d0,d6 | ; determine first term of third sum |
| mac | d1,d7 | ; accumulate second term of third sum |
| mac | d2,d4 | ; accumulate third term of third sum |
| mac | d3,d5 | ; accumulate fourth term of third sum |
| store | ACC,(a0)+ | ; store result F(5) |
| @sum4 | | |
| load | (a1)+,d5 | ; load next input value for next sum |
| clr | ACC | ; initialize accumulator |
| mac | d0,d5 | ; determine first term of fourth sum |
| mac | d1,d6 | ; accumulate second term of fourth sum |
| mac | d2,d7 | ; accumulate third term of fourth sum |
| mac | d3,d4 | ; accumulate fourth term of fourth sum |
| store | ACC,(a0)+ | ; store result F(6) |
| @end | | |

The routine determines four filtered values, but if more than four filtered values are required, the routine can branch from label @end back to label @sum1 and proceed to calculate four more filtered values. The routine can also stop after any one of the sums. Labels @sum1 to @sum4 separate portions of the routine that calculate different sums. The sums require four different codings because replacing the eldest input value with the next value from the input sequence changes the correspondence between registers holding input values and registers holding filter coefficients. For a 4-tap filter there are four possible correspondences between registers holding coefficients and registers holding input values. Generally, an N-tap filter has N possible correspondences and requires N different codings of summations.

Loading or reloading more than one input value for each sum can reduce the length of code. The reduction arises by creating fewer distinct correspondences between registers holding coefficients and registers holding input values. This increases the number of memory access but reduces code length. The reduction in code length is desirable if an instruction cache for the processing core cannot hold the entire routine. If the routine does not fit in the instruction cache, fetching instructions may cause cache misses that delay execution more than the additional load operations for the data sequence. Co-owned U.S. Pat. App. Ser. No. 09/176,739, entitled "Optimizing the Performance of a Computer Architecture having Cache Memory," now U.S. Pat. No. 6,243,807, issued Jun. 5, 2001, which is hereby incorporated by reference in its entirety, describes a method for keeping routines and related data structures in cache memory to minimize cache misses.

Using the multiply-and-accumulate (mac) instructions if available in a processor or otherwise accumulating results in the register file before saving the filtered value to memory reduces the number of memory accesses for store operations.

The coding of Table 2 can be varied to implement different convolution operations. For example, for FIR filters having fewer or more than four taps, the above routine is modified to load the appropriate number of coefficients and input values in the initial steps, sum the correct number of products to be accumulate, and include code for each correspondence between registers holding coefficients and registers holding input values. Additionally, conditional branches inserted in the routine can select the number of summations required to generate the required number of filtered values. Further, FIR filter operations having more taps than can be accommodated in the register file can be divided into a set of "smaller" FIR filter operations that the register file can accommodate, smaller meaning having fewer taps than the desired FIR. Routines such as in Table 2 perform the smaller FIR filter operations, and combining the results from the smaller FIR filter operations provides the desired filter values.

Embodiments of the invention are not limited to FIR filter operations. Table 3 contains a pseudo assembly language code for a convolution operation.

TABLE 3

| | | |
|---|---|---|
| load | $s_{in}0,d0$ | ; load input values into registers d0 to d3 |
| load | $s_{in}1,d1$ | |
| load | $s_{in}2,d2$ | |
| load | $s_{in}3,d3$ | |
| lea | $s_k,a0$ | ; load pointer to first k-dependent sequence |
| @sumk | | |
| load | (a0)+,d4 | ; load k-dependent sequence |
| load | (a0)+,d5 | |
| load | (a0)+,d6 | |
| load | (a0)+,d7 | |
| clr | ACC | ; initialize accumulator |
| mac | d0,d4 | ; determine first term of first sum |
| mac | d1,d5 | ; accumulate second term of first sum |
| mac | d2,d6 | ; accumulate third term of first sum |
| mac | d3,d7 | ; accumulate fourth term of first sum |
| store | ACC,s(k) | ; store result |

The routine of Table 3 determines a single sum. After completion of the routine, the effective address for the next k-dependent sequence is loaded into an address register a0 and the routine branches to label @sumk. The routine decreases load operations because the input sequence is only loaded once and used for all values of k that are of interest. The routine of Table 3 is for a summation for an input sequence $s_{in}$ of length four. A longer input sequence requires using more registers for the summations, and/or by dividing the input sequence into parts. For each part of the input sequence, the process generates partial sums for the different values of k. Combining the partial sums or each value of k provides a final result.

Although the invention has been described with reference to particular embodiments, the description is only an example of the invention's application and should not be taken as a limitation. Various adaptations and combinations of features of the embodiments disclosed are within the scope of the invention as defined by the following claims.

We claim:

1. A method for performing a convolution operation, the process comprising:
    (a) loading a first sequence of values into a first set of registers in a register file in a processor, wherein the convolution operation is a finite impulse response (FIR) filter operation, and the first sequence of values includes filter coefficients for the FIR filter;
    (b) loading a second sequence of values into a second set of registers in the register file;
    (c) summing a set of products, wherein each product results from a multiplication of a value from the first set of registers and a value from the second set of registers;
    (d) loading a new value into the second set of registers, wherein the new value replaces one of the values that was previously loaded into the second set of registers;
    (e) summing a new set of products, wherein each product results from a multiplication of a value from the first set of registers and a value from the second set of registers, and one of the products in the new set includes a product of a value from the first sequence as loaded in step (a) and the new value loaded in step (d);
    (f) loading a third sequence of values into the first set of registers, the third sequence including filter coefficients that are for the FIR filter operation and were not loaded into the first set of registers during step (a);
    (g) loading a fourth sequence of values into the second set of registers;
    (h) summing a set of products, wherein each product results from a multiplication of a value from the first set of registers and a value from the second set of registers; and
    (i) combining a result from the summing in step (h) with a result from the summing in step (c) to generate a filtered value.

2. The method of claim 1, wherein summing the products comprises executing a series of multiply-and-accumulate instructions.

3. The method of claim 1, wherein step (d) further comprises loading a plurality of new values into the second set of registers.

4. The method of claim 3, wherein loading the plurality of new values replaces all of the values loaded in step (b).

5. The method of claim 1, wherein loading in steps (a), (b), (d), (f) and (g) comprises moving one or more values from a memory system attached to the processor into the register file in the processor.

6. The method of claim 1, wherein the fourth sequence of values is a subsequence of an input sequence, and the new value is from the input sequence and immediately follows the subsequence loaded in step (g).

7. The method of claim 1, wherein the second sequence of values is a subsequence of an input sequence, and the new value is from the input sequence and immediately follows the subsequence loaded in step (b).

8. The method of claim 7, wherein of the values in the second set of registers, the value that the new value replaces is earliest in an order that the input sequence defines.

9. The method of claim 8, further comprising repeating steps (d) and (e) a plurality of times.

10. The method of claim 1, further comprising:
    (j) loading a new value into the second set of registers, wherein the new value replaces one of the values from the second sequence that was previously loaded into the second set of registers;
    (k) summing a new set of products, wherein each product results from a multiplication of a value from the first set of registers and a value from the second set of registers, and one of the products in the new set includes a product of a value from the first sequence as loaded in step (f) and the new value loaded in step (j); and
    (l) combining a result from the summing in step (k) with a result from the summing in step (e) to generate a filtered value.

11. The method of claim 8, further comprising repeating steps (d), (e), (j) and (k) a plurality of times.

12. The method of claim 10, wherein of the values in the second set of registers loaded in step (j), the value that the new value replaces is earliest in an order that the input sequence defines.

13. A communication system comprising:
    a processor that includes a register file;
    a memory system storing a processing routine, wherein the processor executes the processing routine by:
        (a) loading a first sequence of values into a first set of registers in the register file, wherein the convolution operation is a finite impulse response (FIR) filter operation, and the first sequence of values includes filter coefficients for the FIR filter;
        (b) loading a second sequence of values into a second set of registers in the register file;
        (c) summing a set of products, wherein each product results from a multiplication of a value from the first set of registers and a value from the second set of registers;
        (d) loading a new value into the second set of registers, wherein the new value replaces one of the values that was previously loaded into the second set of registers;
        (e) summing a new set of products, wherein each product results from a multiplication of a value from the first set of registers and a value from the second set of registers, and one of the products in the new set includes a product of a value from the first sequence as loaded in step (a) and the new value loaded in step (d);
        (f) loading a third sequence of values into the first set of registers, the third sequence including filter coefficients that are for the FIR filter operation and were not loaded into the first set of registers during step (a);
        (g) loading a fourth sequence of values into the second set of registers;
        (h) summing a set of products, wherein each product results from a multiplication of a value from the first set of registers and a value from the second set of registers; and
        (i) combining a result from the summing in step (h) with a result from the summing in step (c) to generate a filtered value.

14. The system of claim 13, wherein executing the processing routine further comprises repeating steps (d) and (e) a plurality of times.

15. The system of claim 13, wherein in each of steps (a), (b), (d), (f) and (g), loading comprises the processor reading a value from the memory system.

16. The system of claim 13, wherein executing the processing routine further comprises:
    (j) loading a new value into the second set of registers, wherein the new value replaces one of the values from the second sequence that was previously loaded into the second set of registers;

(k) summing a new set of products, wherein each product results from a multiplication of a value from the first set of registers and a value from the second set of registers, and one of the products in the new set includes a product of a value from the first sequence as loaded in step (f) and the new value loaded in step (j); and (l) combining a result from the summing in step (k) with a result from the summing in step (e) to generate a filtered value.

* * * * *